United States Patent [19]

Uehara

[11] Patent Number: 5,267,247
[45] Date of Patent: Nov. 30, 1993

[54] SCAN OPERATION EXECUTING SYSTEM

[75] Inventor: Izushi Uehara, Tokyo, Japan

[73] Assignee: NEC Corporation, Tokyo, Japan

[21] Appl. No.: 650,178

[22] Filed: Feb. 4, 1991

[30] Foreign Application Priority Data

Feb. 8, 1990 [JP] Japan ................................. 2-30128

[51] Int. Cl.⁵ .............................................. H04B 17/00
[52] U.S. Cl. .................................. 371/22.3; 371/15.1
[58] Field of Search ................ 371/22.3, 15.1, 16.1, 371/20.1, 22.1

[56] References Cited

U.S. PATENT DOCUMENTS

| | | | |
|---|---|---|---|
| 4,312,066 | 1/1982 | Bantz et al. | 371/16 |
| 4,697,267 | 9/1987 | Wakai | 371/25 |
| 4,876,645 | 10/1989 | Shioya et al. | 364/200 |
| 5,088,034 | 2/1992 | Ihara et al. | 395/700 |
| 5,127,008 | 6/1992 | Bassett et al. | 371/22.1 |

Primary Examiner—Robert W. Beausoliel, Jr.
Assistant Examiner—Phung Chung
Attorney, Agent, or Firm—Foley & Lardner

[57] ABSTRACT

A scan operation executing system includes a command decoding unit and a scan mode setting unit. The command decoding unit is initialized together with a diagnostic control unit in accordance with a diagnostic activation signal from a diagnostic processor, outputs a reset signal in response to a diagnostic command for a scan operation execution request subsequent to the diagnostic activation signal, and outputs a reset signal in response to a diagnostic command for a scan mode reset request. The scan mode setting unit is set by a set signal from the command decoding unit to supply a scan mode signal to a processing unit of a main processor and is reset by the reset signal to disconnect the scan mode signal.

8 Claims, 2 Drawing Sheets

SCAN OPERATION EXECUTING SYSTEM

BACKGROUND OF THE INVENTION

The present invention relates to a scan operation executing system and, more particularly, to a main scan operation executing system for diagnosing a main processor which has a scan path.

In order to perform diagnosis for a main processor, a scan path diagnostic system in which flip-flop inputs and outputs in the main processor are switched to form a single path of the flip-flops and a diagnostic processor which samples information in the scan path have been conventionally used. In the conventional scan path diagnostic system, a diagnostic processor issues a scan operation execution request by using an exclusive diagnostic interface to a processor to shift information in the scan path, thereby sampling the information.

FIG. 2 is a timing chart for explaining an operation performed in the above scan path diagnostic system. This operation will be described below with reference to FIG. 2. In order to perform a diagnostic operation for a main processor, a diagnostic processor outputs a diagnostic activation signal (timing 1) to initialize a diagnostic control unit 9 in the main processor. Since an internal state of the diagnostic control unit 9 is not definite when a diagnostic command is issued, the diagnostic activation signal must be output to perform initialization prior to the command. At the same time, a scan mode set flip-flop (to be referred to as a scan mode F/F hereinafter) in the main processor is reset. When a scan operation execution request is issued by the diagnostic command (timing 3), the scan mode F/F is set by this request (timing 4). Thereafter, data in a scan path 7 is output at the same time as scan data is input in units of clocks to the scan path 7 (after timing 4), and this operation is continuously performed until all items of information in a flip-flop of interest in the main processor are completely sampled. The scan operation is classified into a scan-out operation for sampling information from the main processor and a scan-in operation for loading information in the main processor. In either operation, the task of loading data in the main processor must be performed after the data is sampled from the main processor. Therefore, the diagnostic processor issues the scan operation execution request twice. In addition, unexpected data is sequentially inserted in flip-flops during the scan operation. In order to prevent the illegal operation in an external interface or the internal logic, therefore, the main processor performs inhibition for an external interface signal or an internal operation by using a scan mode signal output from the scan mode F/F.

In the above conventional scan operation executing system, however, upon issuing of the two scan operation execution requests performed in a series of scan-in and scan-out operations, the scan mode F/F is reset by the diagnostic activation signal. Since a timing at which the scan mode signal is inactivated is generated upon issuance of the second scan operation execution request, therefore, an illegal operation may occur in the external interface or the internal logic.

SUMMARY OF THE INVENTION

It is an object of the present invention to provide a scan operation executing system capable of performing a diagnostic operation without causing an illegal operation in the external interface or the internal logic.

In order to perform the above object of the present invention, there is provided a scan operation executing system used in an information processing system constituted by a diagnostic processor and a main processor including a diagnostic control unit connected to the diagnostic processor and a scan path, comprising a command decoding unit, initialized together with the diagnostic control unit in accordance with a diagnostic activation signal from the diagnostic processor, for outputting a reset signal in response to a diagnostic command which is a scan operation execution request subsequent to the diagnostic activation signal and outputting a reset signal in response to a diagnostic command which is a scan mode reset request, and a scan mode setting unit set by a set signal from the command decoding unit to supply a scan mode signal to a processing unit of the main processor and reset by the reset signal to disconnect the scan mode signal.

DETAILED DESCRIPTION OF THE PREFERRED EMBODIMENT

An embodiment of the present invention will be described below with reference to the accompanying drawings.

Figure 1:
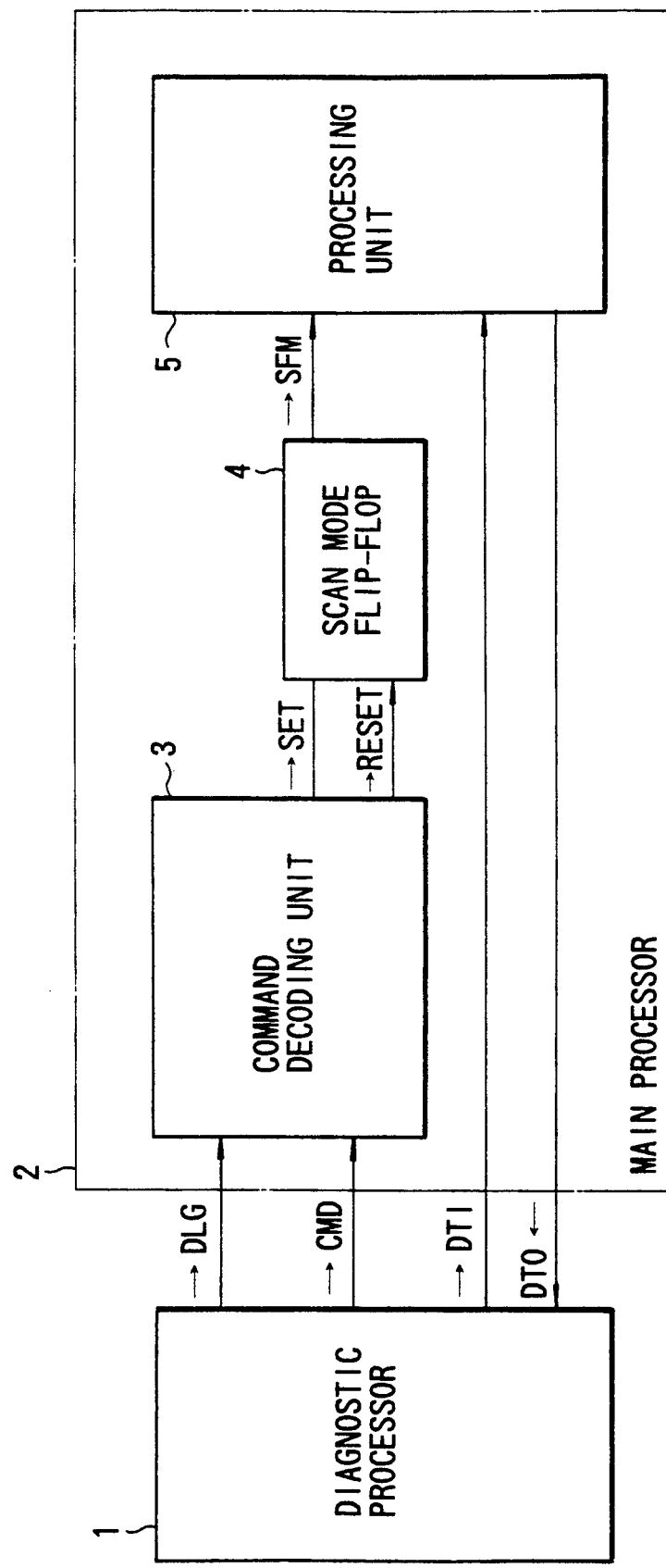
FIG. 1 is a block diagram showing an embodiment of the present invention.
Figure 2:
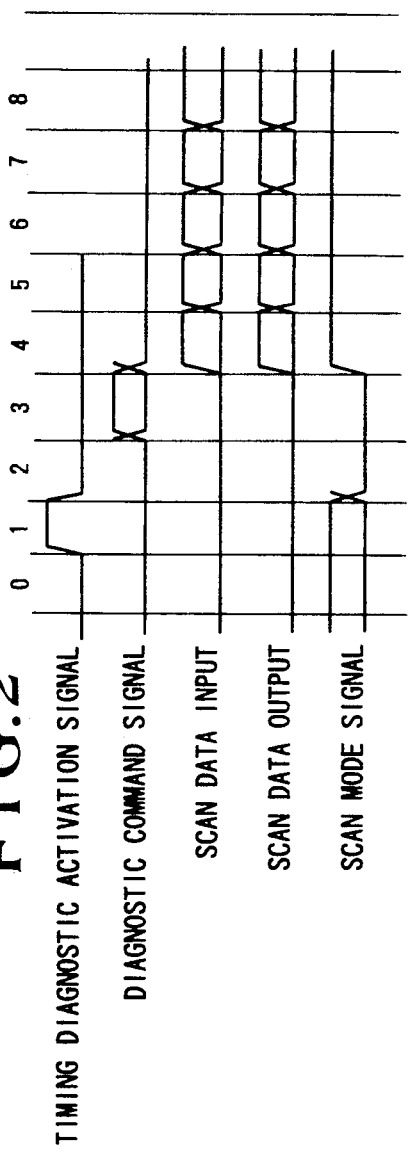
FIG. 2 is a timing chart for explaining an operation of a conventional scan operation executing system.

FIG. 1 shows an arrangement of an embodiment of the present invention. Referring to FIG. 1, a diagnostic processor 1 interfaces with a main processor 2 to provide a diagnostic activation signal DLG, a command signal CMD, and a scan data input signal DTI, to receive a scan data output signal DTO with respect to the main processor 2. The main processor 2 includes a command decoding unit 3 for decoding the command signal CMD and a scan mode flip-flop 4.

If a command signal CMD issued from the diagnostic processor 1 is a scan operation execution request (SCN), the command decoding unit 3 sets "1" as a scan data set signal SET and supplies scan data set the signal set to the scan mode flip-flop 4, thereby setting "1" in the scan mode flip-flop 4. If the command signal CMD is a scan mode reset request (SMR), the command decoding unit 3 sets "1" as a scan mode reset signal RESET and supplies the scan mode reset signal reset to the scan mode flip-flop 4, thereby resetting the scan mode flip-flop 4 to "0". A scan mode signal SFM as an output from the scan mode flip-flop 4 is supplied to a processing unit 5 in the main processor 2 to form a single path of flip-flops in a processing unit 5. The signal SFM is also used to inhibit signal transmission between the processing unit 5 and an external interface or to stop its internal operation.

Figure 3:
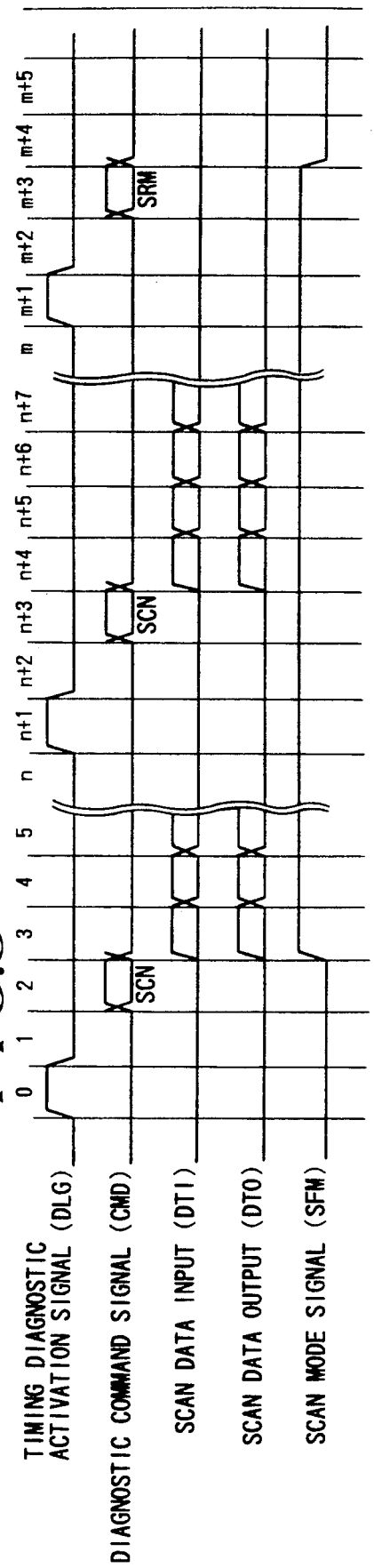
FIG. 3 is a timing chart for explaining an operation of the embodiment shown in FIG. 3.

FIG. 3 is a timing chart for explaining a scan operation of the embodiment shown in FIG. 1. The operation of the embodiment shown in FIG. 1 will be described below with reference to FIG. 3. The diagnostic processor 1 sets "1" as the diagnostic activation signal DLG to perform initialization of a diagnostic control unit (not shown) of the main processor (timing 0). The diagnostic processor 1 sends a scan operation execution request (SCN) as the diagnostic command signal CMD (timing 2) and scan path input data as the scan data input signal DTI (after timing 3). Therefore, the scan mode signal SFM goes to "1" (timing 3), and scan path information in the scan path 7 of page 6 processing unit 5 is carried as the scan data output signal DTO to the diagnostic processor 1. When scan path information of interest is sampled, the diagnostic processor 1 executes the scan operation again in order to load the sampled data directly into the main processor 2 if a scan-out operation is set or to load the sampled data into the main processor 2 after processing the data if a scan-in operation is set. After "1" is set as the diagnostic activation signal DLG (timing n+1), the scan operation execution request (SCN) is supplied to repeat the above operation.

When the scan data is returned to the processor 2, the diagnostic processor 1 sets "1" as the diagnostic activation signal DLG (timing m+1) and sends the scan mode reset request (SMR) as the diagnostic command signal CMD (timing m+3). At the next timing, the scan mode flip-flop 4 is reset, and the scan mode signal SFM goes to "0".

As has been described above, according to the present invention, since the command decoding unit is provided to independently control the scan mode flip-flop, a timing for resetting the scan mode signal during execution of a series of scan operations can be avoided. Therefore, diagnostic operation can be realized without causing disturbance in an external interface or an erroneous operation in internal circuit.

What is claimed is:

1. A scan operation executing system for an information processor, comprising:
    a main processor including a processing unit, having a scan path, for receiving a scanning data signal, for scanning said scan path with said scanning data signal and for outputting a scanned data signal resulting from scanning said scan path;
    scan mode setting means for supplying a scan mode signal to said processing unit for setting said processing unit into a scan mode for scanning said scan path with said scanning data signal during said scan mode signal;
    a diagnostic processor
        for generating a diagnostic activation signal,
        for generating a scan operation execution request signal subsequent to said diagnostic activation signal,
        for generating a scan mode reset request signal,
        for supplying said scanning data signal to said processing unit,
        for receiving said scanned data signal from said scan path, and
        for performing diagnosis of said main processor based upon said scanned data signal; and
    command decoding means
        for receiving and being initialized by said diagnostic activation signal and for resetting said scan mode setting means upon being initialized,
        for receiving said scan operation execution request signal for setting said scan mode setting means, and
        for receiving said scan mode reset request signal for resetting said scan mode setting means.

2. A system as in claim 1, further comprising:
    a diagnostic control unit, responsive to said diagnostic processor and initialized by said diagnostic activation signal, for controlling said command decoding means and said scan mode setting means.

3. A system as in claim 2, wherein,
    said main processor further comprises said diagnostic control unit, said command decoding means and said scan mode setting means.

4. A scan operation executing system for an information processing system comprising:
    a diagnostic processor;
    a main processor to be diagnosed, said main processor including
        a diagnostic control unit,
        a processing unit having a scan path for diagnosis,
        scan mode setting means for setting a scan mode, and
        command decoding means;
    said diagnostic processor generating a diagnostic activation signal, a scan operation execution request signal subsequent to said diagnostic activation signal, and a scan mode reset request signal;
    said scan mode setting means being located between said command decoding means and said processing units;
    said diagnostic control unit, said command decoding means and said processing unit all being connected to said diagnostic processor;
    said diagnostic control unit and said command decoding means being initialized by said diagnostic activation signal supplied from said diagnostic processor;
    said scan mode setting means being reset by initialization of said command decoding means, and set in a scan mode in response to said scan operation execution request signal which is supplied to said command decoding means from said diagnostic processor so that diagnostic operation of said processing unit is executed; and
    said scan mode setting means being reset from said scan mode in response to said scan mode reset request signal which is supplied to said command decoding means from said diagnostic processor so that said diagnostic operation of said processing unit is finished.

5. A system as in claim 4, wherein
    said scan mode setting means initiates a scan mode signal for said processing means, when set in said scan mode, to start said diagnostic operation and ends said scan mode signal for said processing means, when reset from said scan mode to terminate said diagnostic operation;
    said main processor further comprising means for coupling said scan mode signal from said scan mode setting means to said processing unit.

6. A system as in claim 5, wherein
    during said scan mode said diagnostic processor supplies input scan data for said processing unit and said processing unit provides output scan data for said diagnostic processor;
    said main processor further comprising means for coupling said input scan data and said output scan data between said diagnostic processor and said processing unit.

7. A system as in claim 1, wherein
    said scan mode setting means comprises a flip-flop circuit.

8. A scan operation executing system for an information processor, comprising:

a diagnostic processor for generating an initialization signal and scan command signals; and a main processor, coupled to said diagnostic processor and receiving said initialization signal and said scan command signals, said main processor including a processing unit having a scan path subject to a scan operation, command decoding means, responsive to said initialization signal for being initialized, for decoding said scan command signals into a set signal and a reset signal and scan mode setting means, receiving said set and reset signals, for outputting a scan mode signal to said processing unit for inhibiting normal internal operation of said processing unit, for inhibiting normal signal transmission between said processing unit and an external interface of said processing unit and for initiating said scan operation of said scan path;

said scan command signals from said diagnostic processor comprising a scan operation execution signal and a scan mode reset request signal;

said set signal from said command decoding means being a scan data set signal outputted in response to said scan operation execution signal; and said reset signal from said command decoding means being a scan mode reset signal outputted in response to said scan mode reset request signal.

* * * * *